(12) United States Patent
Imblum

(10) Patent No.: US 7,362,565 B2
(45) Date of Patent: Apr. 22, 2008

(54) DISK DRIVE SUPPORT SYSTEM

(75) Inventor: Raymond William Imblum, Corona, CA (US)

(73) Assignee: Dot Hill Systems Corporation, Carlsbad, CA (US)

( * ) Notice: Subject to any disclaimer, the term of this patent is extended or adjusted under 35 U.S.C. 154(b) by 366 days.

(21) Appl. No.: 11/055,548

(22) Filed: Feb. 10, 2005

(65) Prior Publication Data

US 2006/0061955 A1    Mar. 23, 2006

Related U.S. Application Data

(60) Provisional application No. 60/611,864, filed on Sep. 21, 2004.

(51) Int. Cl.
*H05K 7/00*    (2006.01)
(52) U.S. Cl. ...................... 361/685; 361/727
(58) Field of Classification Search ............... 361/685, 361/727
See application file for complete search history.

(56) References Cited

U.S. PATENT DOCUMENTS

| | | | |
|---|---|---|---|
| 5,343,357 A | 8/1994 | Driscoll et al. | |
| RE35,915 E | 10/1998 | Hastings et al. | |
| 5,912,799 A | 6/1999 | Grouell et al. | |
| 6,373,694 B1 * | 4/2002 | Chang | 361/685 |
| 6,381,139 B1 * | 4/2002 | Sun | 361/725 |
| 6,388,875 B1 * | 5/2002 | Chen | 361/685 |
| 6,392,884 B1 * | 5/2002 | Chou | 361/687 |
| 6,442,021 B1 | 8/2002 | Bolognia et al. | |
| 6,556,432 B2 * | 4/2003 | Chen et al. | 361/685 |
| 6,611,424 B2 * | 8/2003 | Huang | 361/685 |
| 6,621,693 B1 | 9/2003 | Potter et al. | |
| 6,636,422 B1 * | 10/2003 | Tanzer et al. | 361/687 |
| 7,092,245 B2 * | 8/2006 | Shih | 361/679 |
| 7,145,776 B2 * | 12/2006 | King et al. | 361/725 |
| 2002/0050552 A1 | 5/2002 | Reznikov et al. | |
| 2003/0081378 A1 | 5/2003 | Debbins et al. | |
| 2004/0070930 A1 * | 4/2004 | Scherer et al. | 361/685 |
| 2004/0189163 A1 | 9/2004 | Liu et al. | |

* cited by examiner

*Primary Examiner*—Jayprakash Gandhi
*Assistant Examiner*—Ingrid Wright
(74) *Attorney, Agent, or Firm*—Richard Konneker; James W. Huffman

(57) ABSTRACT

A housing structure is provided for supporting vertically stacked horizontally extending arrays of forwardly removable disk drives in a very compact arrangement. The housing has spaced apart vertical walls with opposite side surface grooves having laterally projecting elastomeric bumper members therein. Pairs of front and rear disk drives are joined with elongated support plates disposed on their opposite sides and having spaced apart sloping side edge portions. The support plates are slidingly received in the wall grooves and wedgingly engage the resilient bumpers in a manner restraining movement of the inserted disk drives along three mutually perpendicular axes. Latch structures lock the inserted drives in the housing and releasably maintain resilient insertion forces on the tandem drive assemblies. A fan system draws cooling air through vertical gaps between the drives, and operational drive heat is conducted via the support plates into the vertical housing walls.

31 Claims, 10 Drawing Sheets

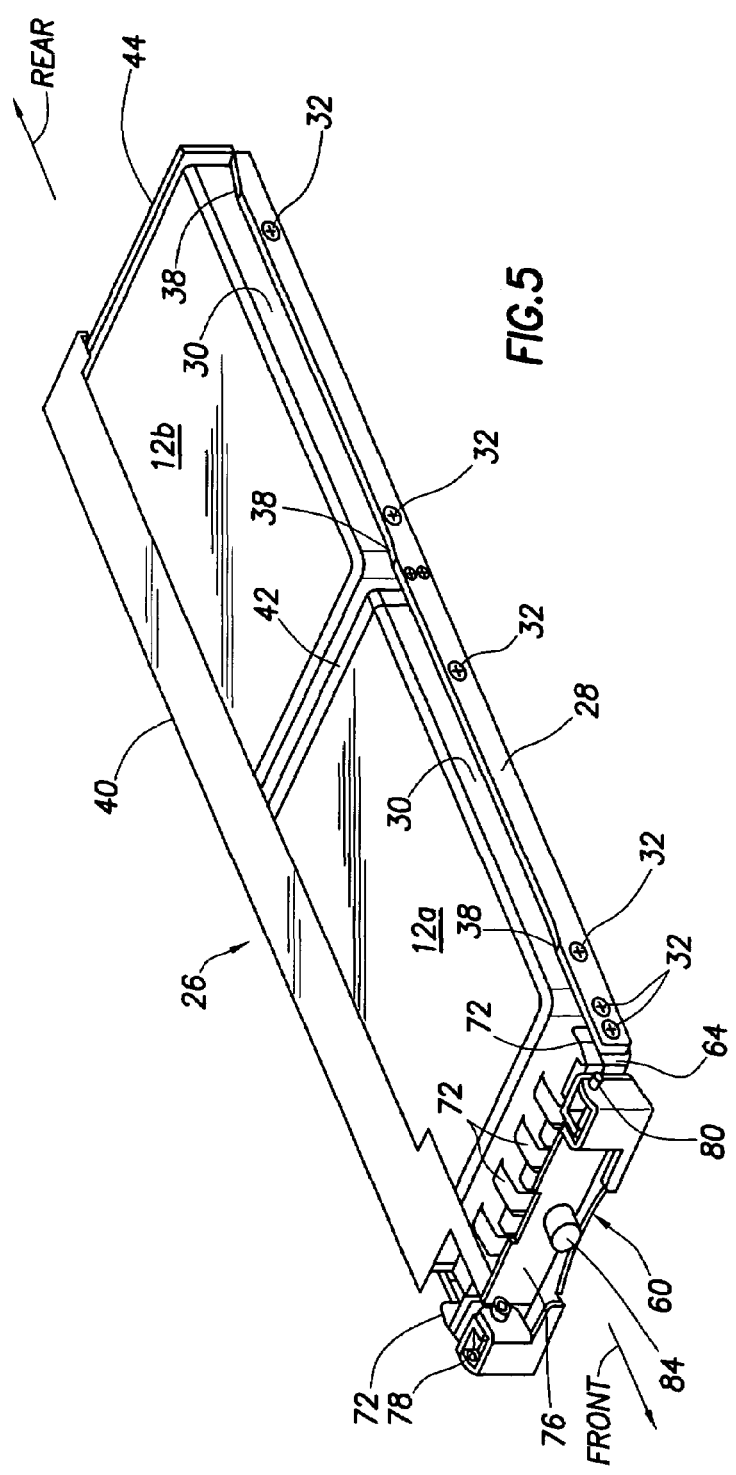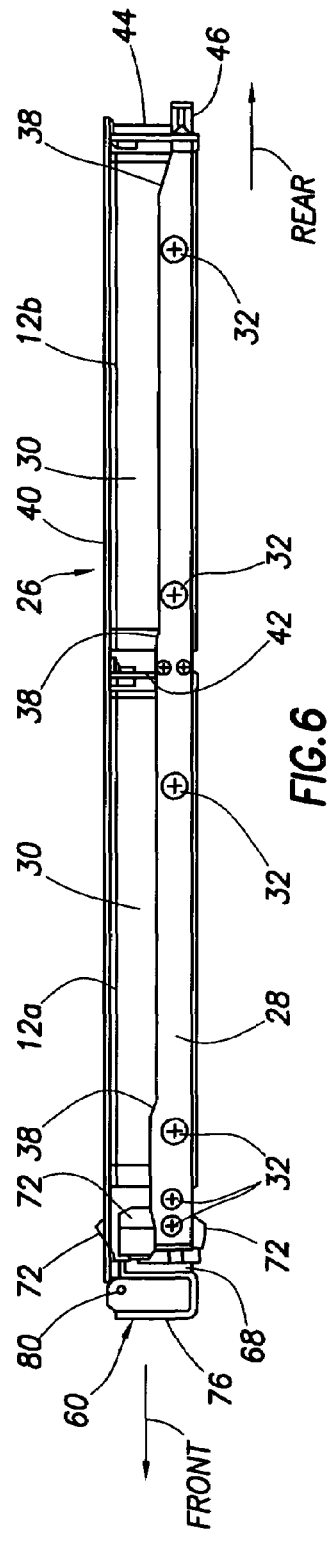

DISK DRIVE SUPPORT SYSTEM

CROSS-REFERENCE TO RELATED APPLICATION

This application claims the benefit of the filing date of U.S. Provisional Application Ser. No. 60/611,864 filed on Sep. 21, 2004 and entitled "HIGH CAPACITY STORAGE ENCLOSURE", such provisional application being hereby incorporated herein by reference in its entirety.

BACKGROUND OF THE INVENTION

The present invention generally relates to electronic apparatus and, in a preferred embodiment thereof, more particularly provides apparatus for compactly supporting in a housing structure a stacked array of horizontally removable disk drives or other types of electronic packages.

Horizontally extending series of hard disk drives are often mounted in a vertically stacked array in a metal housing structure which protects the disk drives and permits their removal for repair and replacement as necessary. It is considered desirable in this technology to place these supported disk drives in as compact an arrangement as possible to provide additional space for related electronic equipment.

To provide convenient access to the housing-supported disk drives, it has been a conventional practice to support each horizontally extending series of disks on the bottom wall of a tray which may be moved horizontally into and out of the housing. Using this conventional method of supporting and storing multiple disk drives, removal of a given drive requires that its associated tray be pulled horizontally outwardly to provide for subsequent vertical removal of the selected disk drive from its tray. This support configuration limits the practical height of the disk drive support housing since, if the top of the housing is too high, a technician may not be able to conveniently reach one of the uppermost disk drives and lift it out of its support tray without using a ladder, step stool or the like. Additionally, the weight of the disk drives in one or more upper trays which are opened may exert a sufficient tipping force on the housing that it could topple forward, thereby damaging disks and possibly injuring a person in front of the housing.

When supported disk drive arrays are provided with more and more compact storage arrangements, the provision of ample operational heat dissipation becomes an increasingly difficult design challenge. Additionally, with more disk drives per unit of housing disk storage volume, the problems of shock and vibration of the supported disk drive arrays in various directions correspondingly increases.

As can be seen from the foregoing, a need exists for improvements in apparatus for compactly supporting stacked arrays of disk drives or other types of electronic packages. It is to this need that the present invention is directed.

SUMMARY OF THE INVENTION

In carrying out principles of the present invention, in accordance with a preferred embodiment thereof, electronic apparatus is provided in which vertically stacked horizontally extending series of electronic packages, representatively disk drives, are supported in a highly compact manner within a housing structure for forward removal therefrom. Illustratively, the array of supported disk drives is in a 4U48 form factor.

According to one aspect of the invention, the electronic apparatus comprises a housing structure including a pair of spaced apart parallel walls having facing side surfaces with elongated grooves formed therein and having projections disposed in the grooves. An electronic package, representatively a disk drive, has opposite side surfaces, and elongated parallel support members are secured to these opposite side surfaces and are slidingly received in the grooves. The support members have longitudinally sloped side edge portions wedgingly and resiliently engaged with the projections in the grooves. Preferably, the support members are of a rigid material, and the projections are of a resilient material. The parallel walls are illustratively vertical walls of a metal construction, and the support members are also of a metal construction so that conductive metal-to-metal heat dissipation paths are formed from the supported disk drives to these vertical support walls.

According to a further aspect of the invention, an elongated spring structure is supported at opposite ends thereof on opposite sides of a front end portion of the disk drive, and a specially designed latch structure is provided. The latch structure is secured to a longitudinally central portion of the spring structure and has a pivotal handle portion releasably locked to the housing structure. The releasably locked pivotal handle structure creates a deflection of the spring structure in a manner causing it to exert a rearwardly directed resilient force on the disk drive and a forwardly directed resilient force on the pivotal latch handle portion.

In a representatively illustrated form of the latch structure, the parallel support walls of the housing structure have front edge portions with recesses formed therein which form cam surfaces, and a cam portion of the latch structure is defined by opposite end pin portions of the handle structure which are insertable into the recesses and slidably and cammingly engageable with edge portions thereof as the handle structure is rotated relative to the front end portion of the disk drive. The latch structure preferably further includes a rigid support structure secured to a longitudinally central portion of the spring structure, with the handle portion being pivotally secured to and forcibly bearing against the rigid support structure in a manner causing it to rearwardly deflect the spring structure.

In accordance with a further feature of the invention a pair of electronic packages, illustratively front and rear disk drives, are supported on a pair of the elongated support plate members for conjoint rear insertion into the housing structure and forward removal therefrom. A first vertical circuit board is disposed between the front and rear disk drives and electrically coupled to the front disk drive, a second vertical circuit board is disposed behind the rear disk drive and electrically coupled thereto, and a horizontally oriented, generally strip-shaped bridging circuit board extends forwardly and rearwardly along relatively small top side portions of the two disk drives and is electrically coupled to their associated vertically oriented circuit boards.

In an illustrated preferred embodiment of the overall electronic apparatus, the apparatus further comprises additional non-drive electronic components disposed within the housing structure, and a suitable cooling system for flowing cooling air over the disk drives and these additional non-drive electronic components.

BRIEF DESCRIPTION OF THE DRAWINGS

FIG. 5 is an enlarged scale solid line front perspective view of the removed disk drive assembly shown in phantom in FIG. 1;

FIG. 6 is a right side elevational view of the removed disk drive assembly shown in FIG. 5;

FIG. 14 is an enlarged detail view of the dashed circle area "14" in FIG. 13;

FIG. 4.

DETAILED DESCRIPTION

Figure 1:
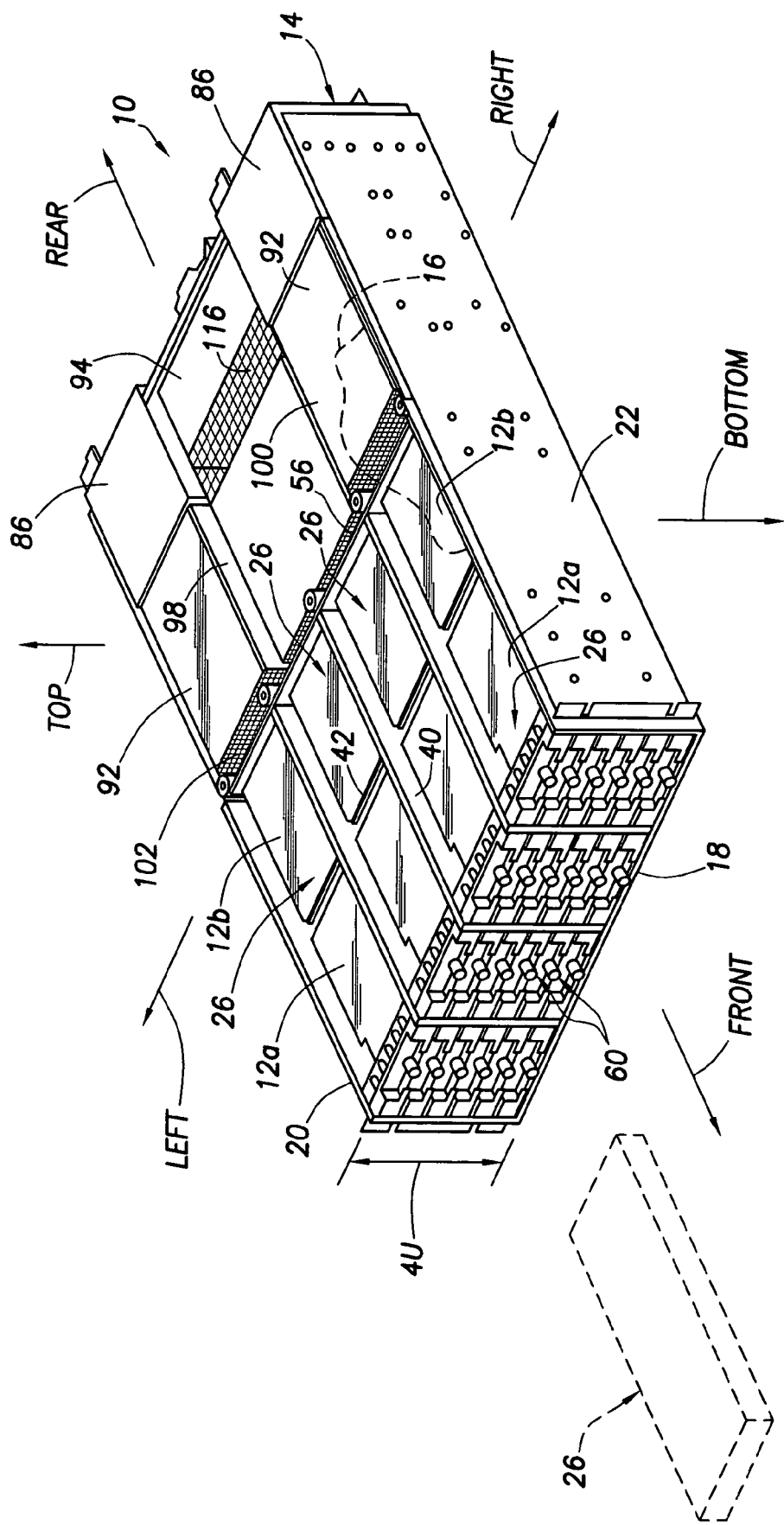
FIG. 1 is a front perspective view of a disk drive support system embodying principles of the present invention, with one of the supported tandem disk drive assemblies being schematically illustrated in a phantomed, forwardly removed position.

With initial reference to FIGS. 1-4, this invention provides apparatus 10 for very compactly and efficiently supporting, representatively in a 4U48 form factor ("U" being a standard disk storage height unit equal to 1.75"), vertically stacked horizontally extending arrays of disk drives 12. The forty eight illustrated disk drives 12 may be generically referred to as "electronic packages" or "electronic devices", and various other types of electronic packages or devices such as, by way of example and not of limitation, solid state disk drives, RAID controllers and the like, may be supported in the manner subsequently described herein without departing from principles of the present invention.

The apparatus 10 includes a rectangular metal housing 14 having open front and rear ends, a horizontal top side wall 16 (a portion of which is shown, in phantom, only in FIGS. 1 and 4), a horizontal bottom side wall 18, left and right vertical side walls 20 and 22, and a horizontally spaced series of vertical interior metal support walls 24 (see FIGS. 3 and 4) which are preferably of an aluminum construction.

Referring additionally now to FIGS. 5-8, the disk drives 12 are supported in pairs, each pair including a front disk drive 12a and a rear disk drive. 12b, that form a part of a disk drive or electronic package assembly 26. Disk drives 12a, 12b in each pair thereof are intersecured by a pair of specially designed elongated metal support plates 28 (only one of which is visible in FIGS. 5-7) which longitudinally extend horizontally along opposite vertical side edge portions 30 of the front and rear disk drives 12a, 12b and are secured thereto by screws 32 or other suitable fastening devices. Preferably, the support plate members 28 are formed from aluminum.

Figure 7:
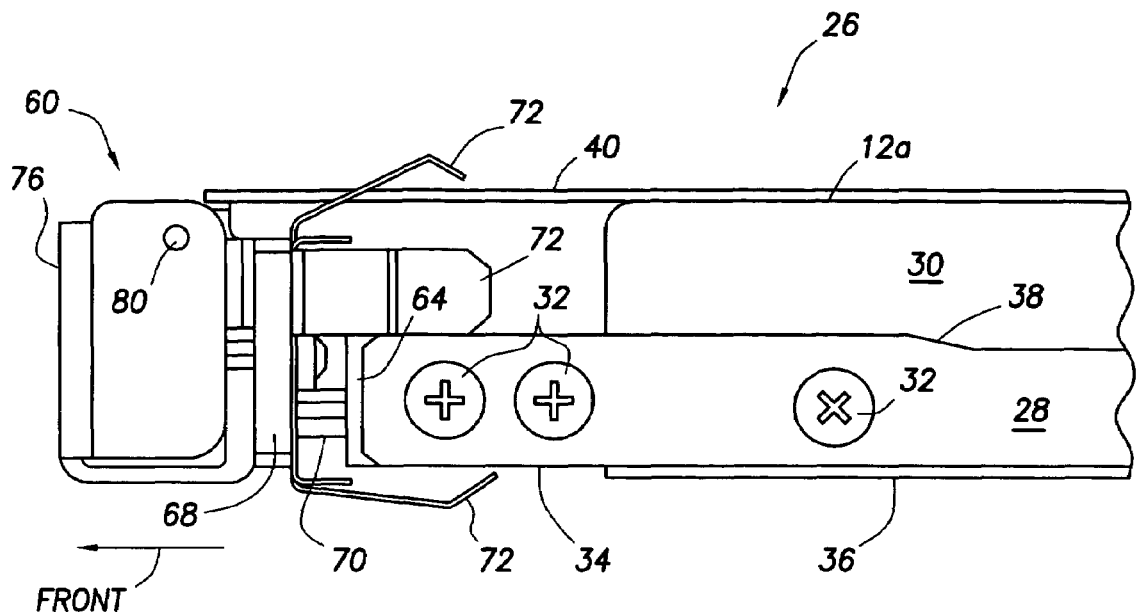
FIG. 7 is an enlarged scale detail view of a front end portion of the removed disk drive assembly shown in FIG. 6.

As can best be seen in FIG. 7, the bottom side edges 34 of the uniquely configured elongated support plates 28 are straight, and are positioned slightly above the bottom sides 36 of their associated disk drives 12a, 12b that they supportingly interconnect. The top side edges of the elongated support plates 28, however, are not straight. Instead, as best illustrated in FIG. 6, the vertical width of each support plate 28 decreases in stages along the length of the support plate in a rearward direction, with each rearwardly successive section of the top edge of the support plate 28 being separated from its forwardly preceding vertically wider section by a rearwardly and downwardly sloped section 38 of the top side edge of the elongated support plate 28. Representatively, these top side edge sections 38 slope downwardly and rearwardly at an angle of approximately 15 degrees.

The front and rear disk drives 12a, 12b in each disk drive package or electronic package assembly 26 are electrically coupled to one another by three circuit boards—an elongated, generally strip-shaped bridging circuit board 40 longitudinally extending along a left top side portion of the disk drives 12a, 12b, a vertical circuit board 42 disposed between the two disk drives 12a, 12b and coupled to the bridging circuit board 40, and a vertical circuit board 44 disposed behind the rear end of the rear disk drive 12b, coupled to the bridging circuit board 40 and also electrically coupled to a rearwardly projecting electrical hot plug connector 46 at the rear end of the rear disk drive 12b. Hot plug connector 46 is suitably anchored to the rear ends of the elongated support plates 28.

As can best be seen in FIG. 1, the disk drive assemblies 26 (each containing front and rear tandem mounted disk drives 12a and 12b) are supported within the housing 14 in an arrangement in which there are four columns of six vertically stacked disk drive assemblies 26. According to a feature of the present invention, each disk drive assembly 26 may be individually removed from the housing 14 in a forward direction as indicated in phantom in FIG. 1. There is no need to move any of the assemblies 26 forwardly out of the housing 14 and then upwardly from a support tray.

Any of the removed disk drive assemblies 26 may be easily inserted in a rearward direction into the housing 14 in a manner utilizing the specially configured support plates or rails 28 to support the inserted disk drive assembly 26 on the interior housing walls 24 in a manner which will now be described in conjunction with FIGS. 13-16.

The vertical interior housing walls 24 (see FIG. 3 also) are of a relatively thick metal construction (preferably aluminum) and have vertically spaced series of horizontally elongated side surface grooves 48 formed thereon. Grooves 48 longitudinally extend in front-to-rear directions and have rectangular cross-sections along their lengths. As can best be seen in FIG. 13, each of the grooves 48 has a configuration along its length which is complementary to that of one of the elongated support plates 28 on the disk drive assemblies 26. Specifically, each groove has a height which decreases in stages rearwardly along its length to complementarily receive corresponding reduced height longitudinal sections of one of the support plates 28 when it is longitudinally inserted into the groove 48 as subsequently described herein. This staged height reduction of each groove 48 provides it (as can best be seen in FIG. 13) a front end portion 48a, a vertically shorter longitudinally intermediate portion 48b, and a still vertically shorter rear end portion 48c.

Figure 15:
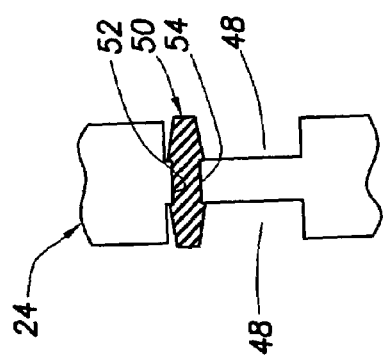
FIG. 15 is an enlarged scale schematic cross-sectional view through one of the vertical housing support walls of drive support system taken along line 15-15 of FIG. 13.
Figure 13:
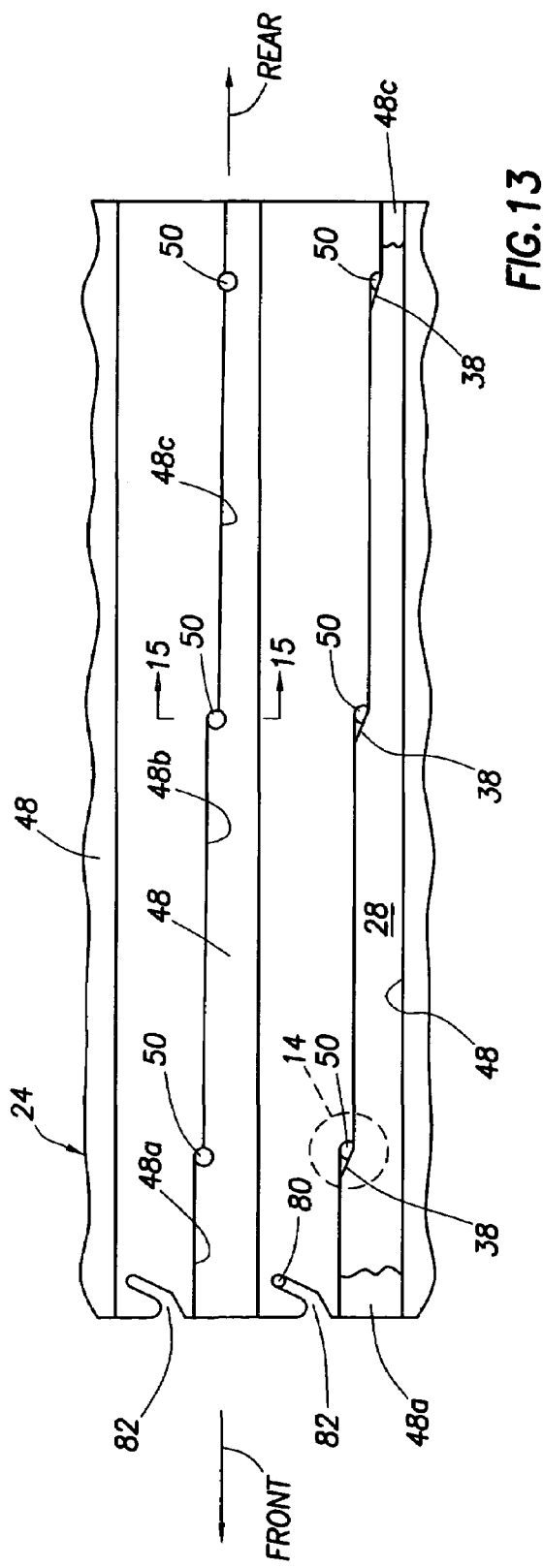
FIG. 13 is a schematic cross-sectional view through a portion of the drive support system taken along line 13-13 of FIG. 3.

Turning now to FIGS. 13 and 15, in each of the grooves 48 three elongated elastomeric bumper members 50 form projections which extend into the groove 48 and which are snap-fitted into circular openings 52 formed transversely through the associated vertical support wall 24 inwardly adjacent the top side edge of the groove 48. In each groove 48, one bumper member or projection 50 is positioned at the juncture of the groove sections 48a and 48b, the second bumper member or projection 50 is positioned at the juncture of the groove sections 48b and 48c, and the third bumper member or projection 50 is positioned near the rear end of the groove section 48c. As can be best seen in FIG. 15, a cylindrical longitudinally central portion 54 of each bumper member 50 is diametrically reduced for close receipt in the associated wall hole 52 to thereby captively retain the snap-fitted bumper member 50 in the hole 52, with opposite, slightly tapered cylindrical end portions of each bumper member 50 longitudinally extending transversely to the wall 24 on its opposite sides within the grooves 48. As will be readily appreciated, for the leftmost and rightmost vertical support walls 24 only one side of each wall needs to be grooved, and the associated bumpers have slightly different configurations since only one end of each bumper needs to project through a wall groove.

Figure 16:
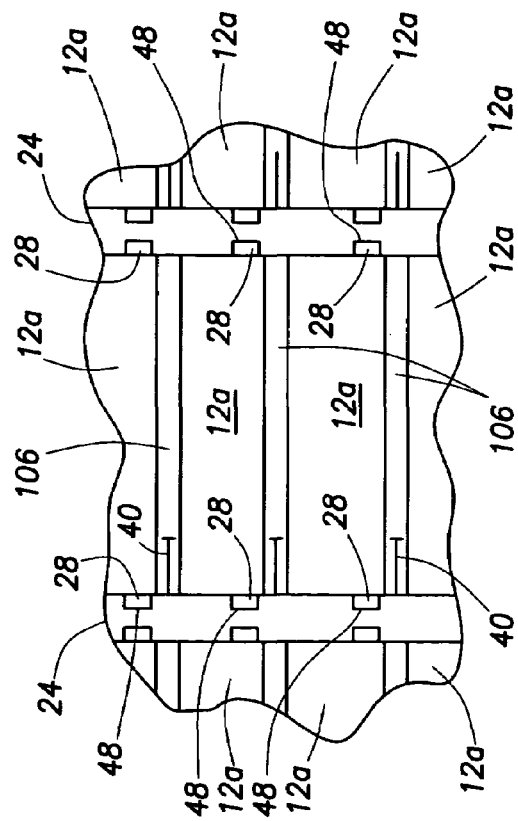
FIG. 16 is a schematic cross-sectional view through the drive support system taken along line 16-16 of FIG.

To operatively insert any one of the disk drive assemblies 26 into the housing 14, rear end portions of the assembly's side support plates 28 are simply inserted into horizontally opposing pairs of grooves 48 on two of the vertical support walls 24 (see FIG. 16). The now partially inserted disk drive assembly 26 is then moved rearwardly through the housing 14, thereby causing the support plates 28 to slidingly move through their associated wall grooves 48 until the hot plug connector 46 on the rear end of the inserted assembly 26 (see FIG. 6) mates with a corresponding hot plug socket structure (not illustrated) on a vertically oriented midplane circuit board 56 (see FIGS. 1, 2 and 4) disposed within the housing 14. This electrically couples the disk drives 12a,12b on the inserted assembly 26 to other electronic components carried by the housing 14 and subsequently described herein.

According to a feature of the present invention, as the inserted disk drive assembly 26 rearwardly reaches its operatively supported position within the interior of the housing 14, the longitudinally sloped top edge portions 38 of the elongated support plates 28 wedgingly engage and resiliently deform the ends of the elastomeric bumper members 50 in lateral directions within their associated wall grooves 48 as may be best seen in FIGS. 13 and 14. While the inserted assembly 26 is maintained in this fully inserted position, the resulting wedging frictional engagement between the sloping top side edge portions 38 of the support plate members 28 and the deformed bumpers 50 desirably locks the support plate members 28, and thus the disk drives 12a,12b which they carry, against undesirable movement relative to the housing in front-to-rear, side-to-side, and vertical directions.

The inserted disk drive or electronic package assemblies 26 are removably maintained in this fully inserted orientation by a specially designed resilient latch structure 60 forming a front end portion of each assembly 26 (see FIGS. 1-4). As best illustrated in FIGS. 5-8, each latch structure 60 includes an elongated, generally U-shaped drive spring member 62 formed from a metal strip and having opposite ends 64 secured to the front ends of the elongated support plates 28, as by screws 32, and an elongated body portion 66 extending between the opposite spring ends 64 and disposed in a forwardly spaced relationship with the front end of the disk drive 12a.

Each latch structure 60 also includes a horizontally elongated rigid support plate structure 68 disposed forwardly of the spring body 66 and secured to a longitudinally central portion thereof by suitable fasteners 70. Secured to the rear side of the support structure 68 is a metal RFI suppression structure having outwardly projecting resilient finger portions 72 designed to engage corresponding finger portions on adjacent drive assemblies, for static discharge and RFI suppression purposes, when their associated drive assembly is inserted into the housing 14 as previously described.

Using the illustrated pin members 74, a body or handle portion 76 of the overall latch structure 60 that forms a front side portion thereof is secured to upwardly projecting opposite end portions 78 of the support plate structure 68 for pivotal motion relative thereto about a horizontal axis parallel to the front side of the disk drive 12a. Opposite end portions of the latch body portion 76 carry outwardly projecting cam pins 80 spaced apart along an axis parallel to and disposed somewhat higher than the pivot axis of the latch body portion.

After a particular disk drive assembly 60 is inserted into the housing 14 as previously described herein, and mated with an associated hot plug connector structure on the midplane circuit board 56, the cam pins 80 have entered a pair of curved, horizontally opposing cam recesses 82 (see FIG. 13) on front edge portions of the two vertical support walls 24 between which the assembly 26 has been inserted, with the latch body portion 76 in a forwardly and upwardly pivoted orientation. The latch body portion 76 is then pivoted downwardly and rearwardly to cause its cam pins 80 to move upwardly in the cam recesses 82 (see FIG. 13).

Figure 8:
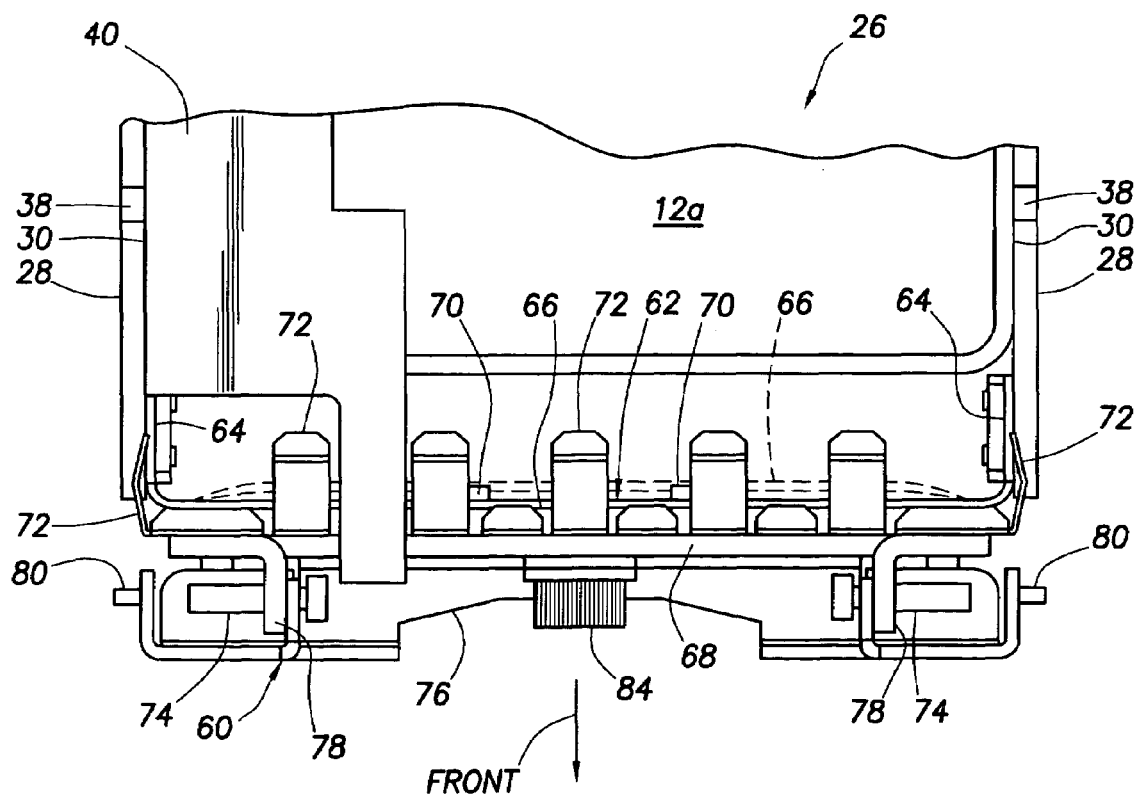
FIG. 8 is a top plan view of the removed disk drive assembly portion shown in FIG. 7.
Figure 9:
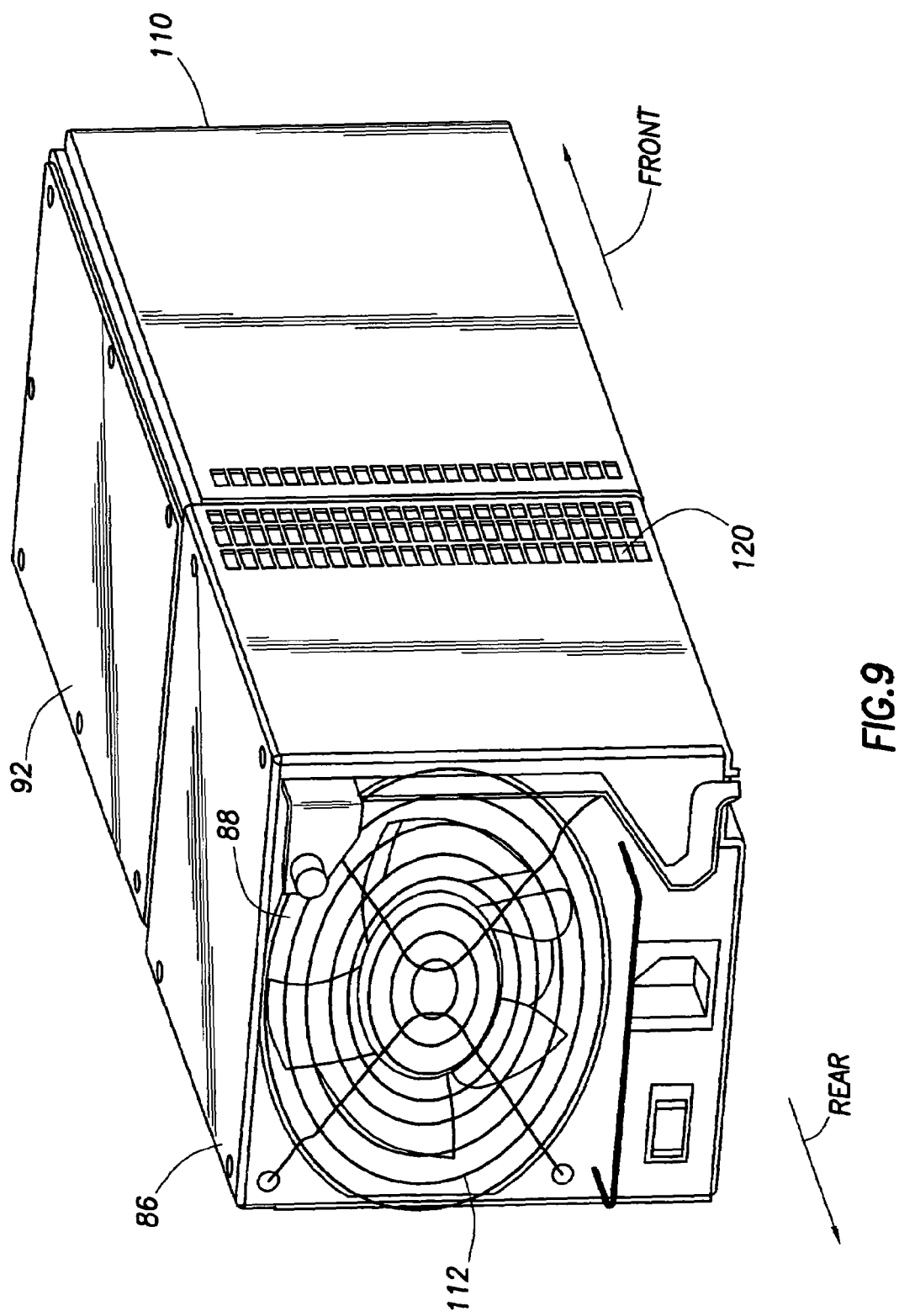
FIG. 9 is a rear perspective view of a cooling fan/power module subassembly removed from the disk drive support system.
Figure 10:
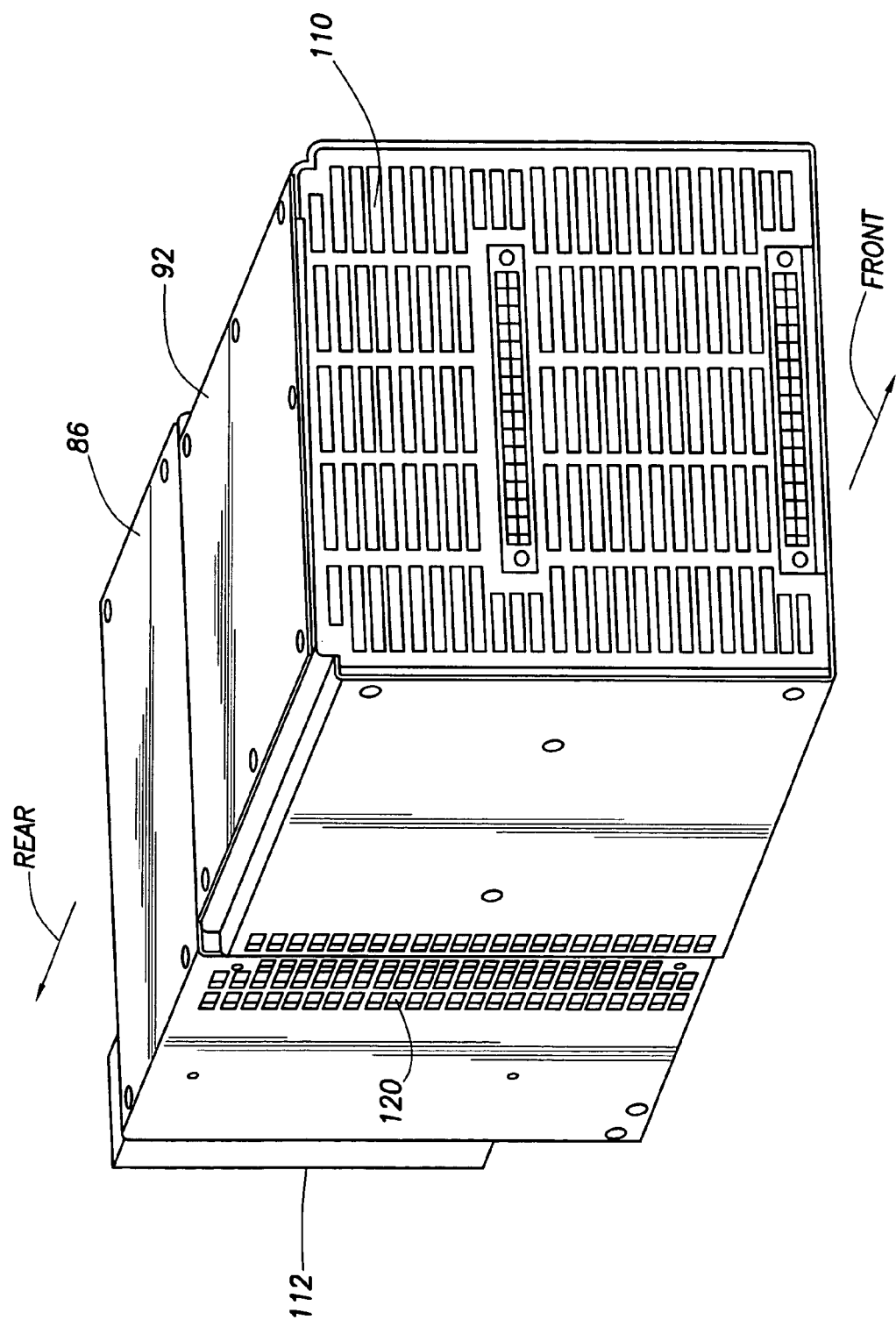
FIG. 10 is a front perspective view of the removed cooling fan/power module subassembly.
Figure 11:
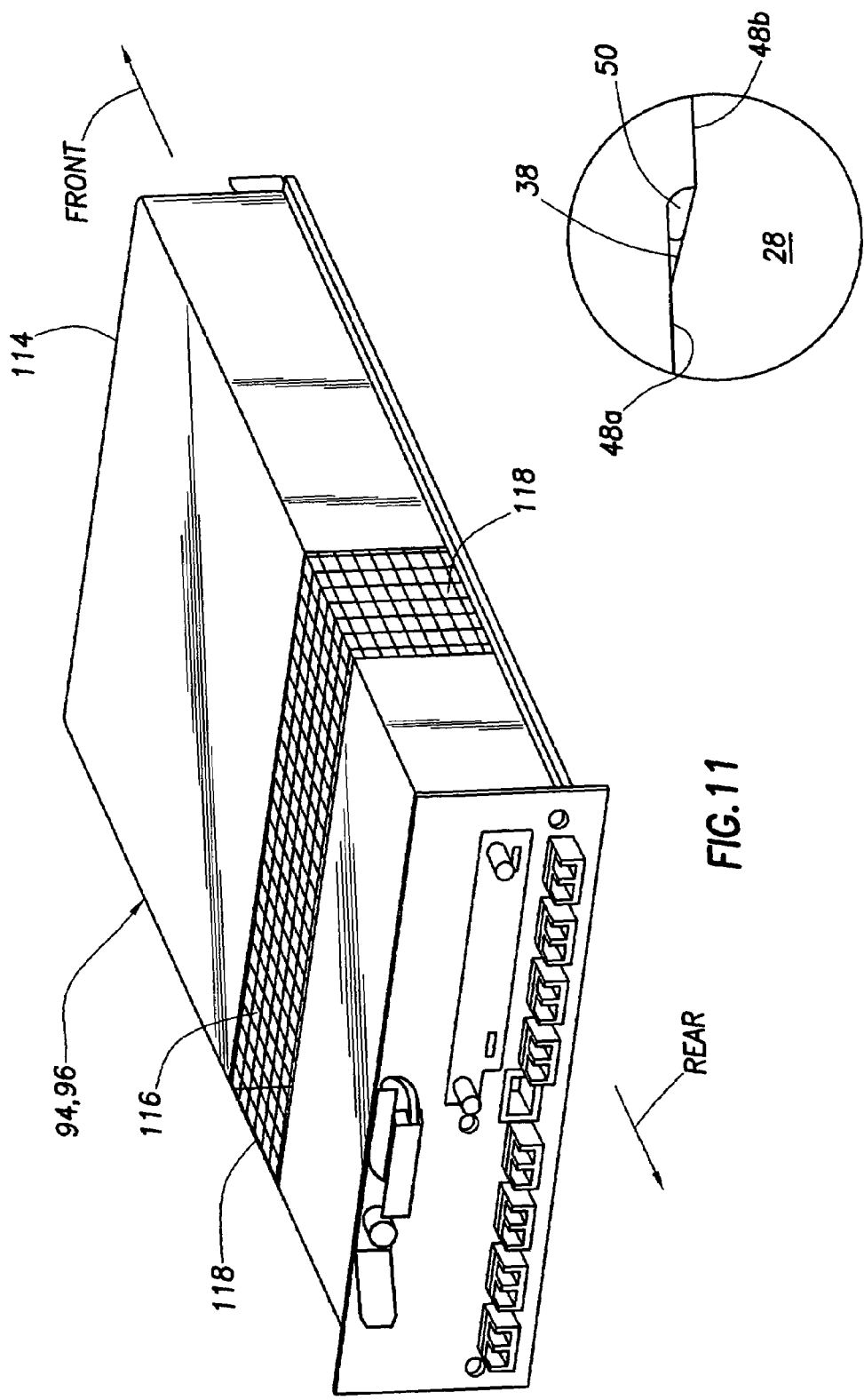
FIG. 11 is a rear perspective view of an electronics section removed from the disk drive support system.
Figure 12:
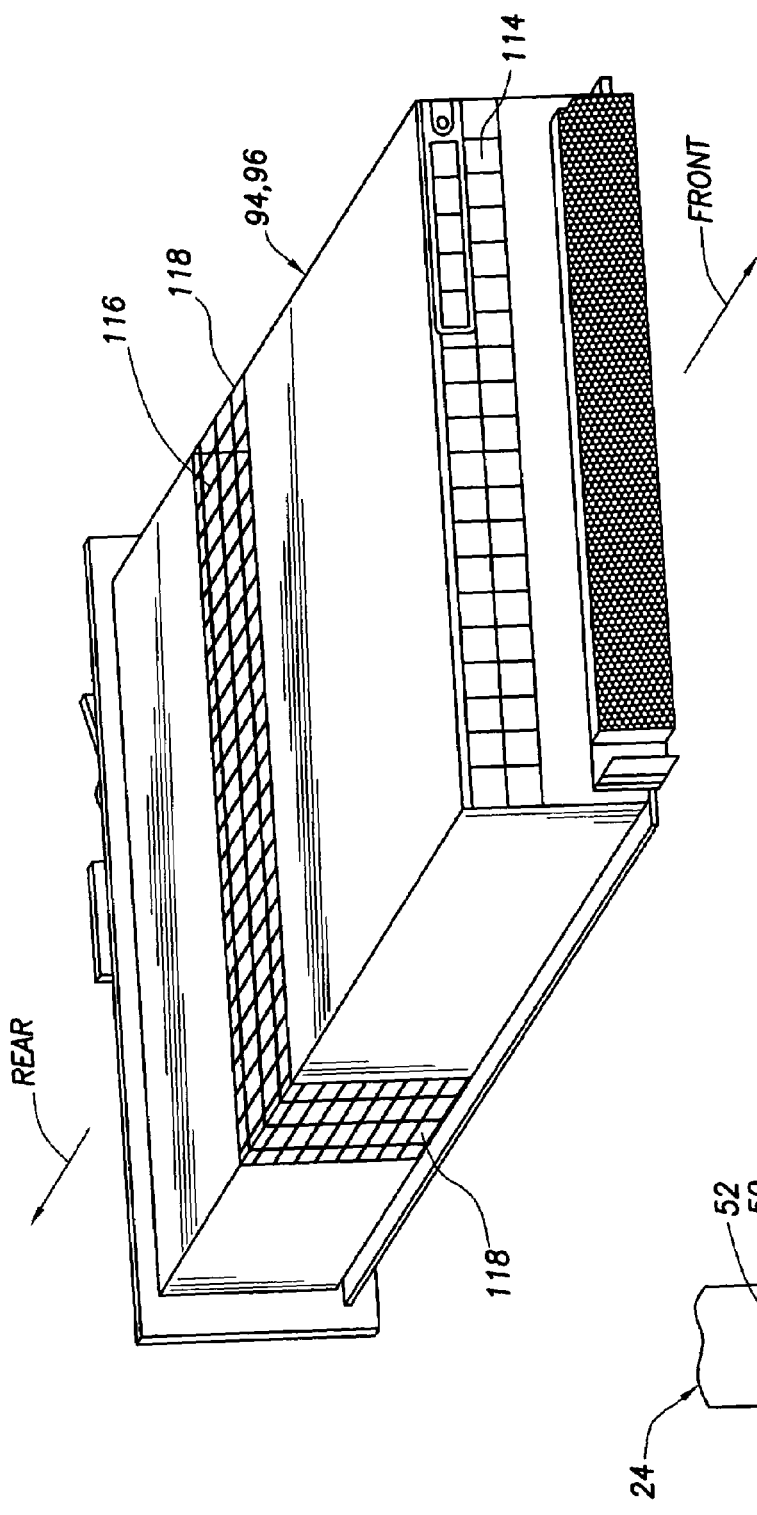
FIG. 12 is a front perspective view of the removed electronics section.

This downward and rearward pivoting of the latch body portion 76 causes a front side thereto to forcibly engage the support plate structure 68 and move it rearwardly, thereby rearwardly deflecting the body portion 66 of the spring member 62, moving it to its dotted line deflected position shown in FIG. 8. The downwardly pivoted latch body portion 76 is then releasably locked to the support plate structure 68 using the indicated center screw member 84. This holds the spring body portion 66 in its indicated forwardly deflected dotted line position in which it maintains a resilient, rearwardly directed insertion force on the disk drive assembly 26, and a rearwardly directed resilient force on the latch body or handle portion 76 to keep it from rattling during operation of the disk drives. When it is desired to remove the inserted disk drive assembly 26, the center screw is loosened to free the latch body portion 76 which is then pivoted upwardly and rearwardly to permit removal of the inserted disk drive assembly 26.

Figure 4:
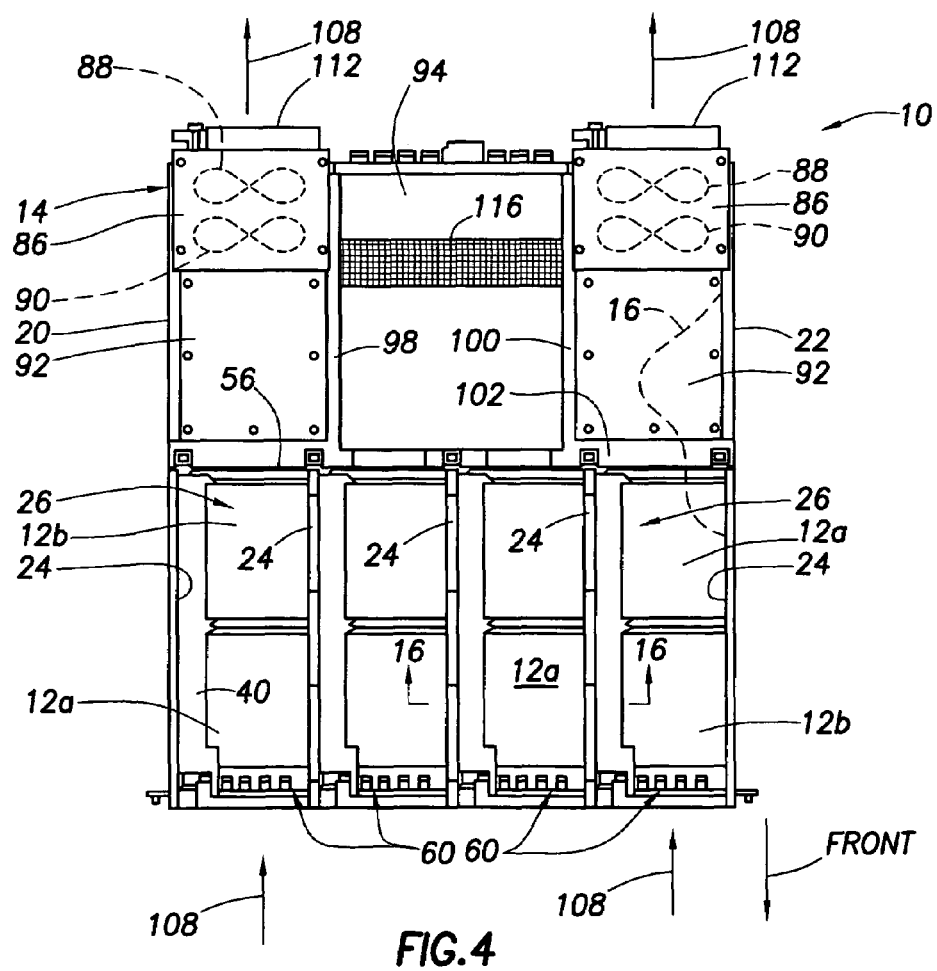
FIG. 4 is a top plan view of the support system.

In addition to very compactly supporting the disk drives 12 in their representatively illustrated 4U48 form factor, the apparatus 10 also comprises various other electronic components within the housing 14, disposed rearwardly of and operatively associated with the tandem disk drive assemblies 26, which will now be described in conjunction with FIGS. 1, 2 and 4.

Figure 2:
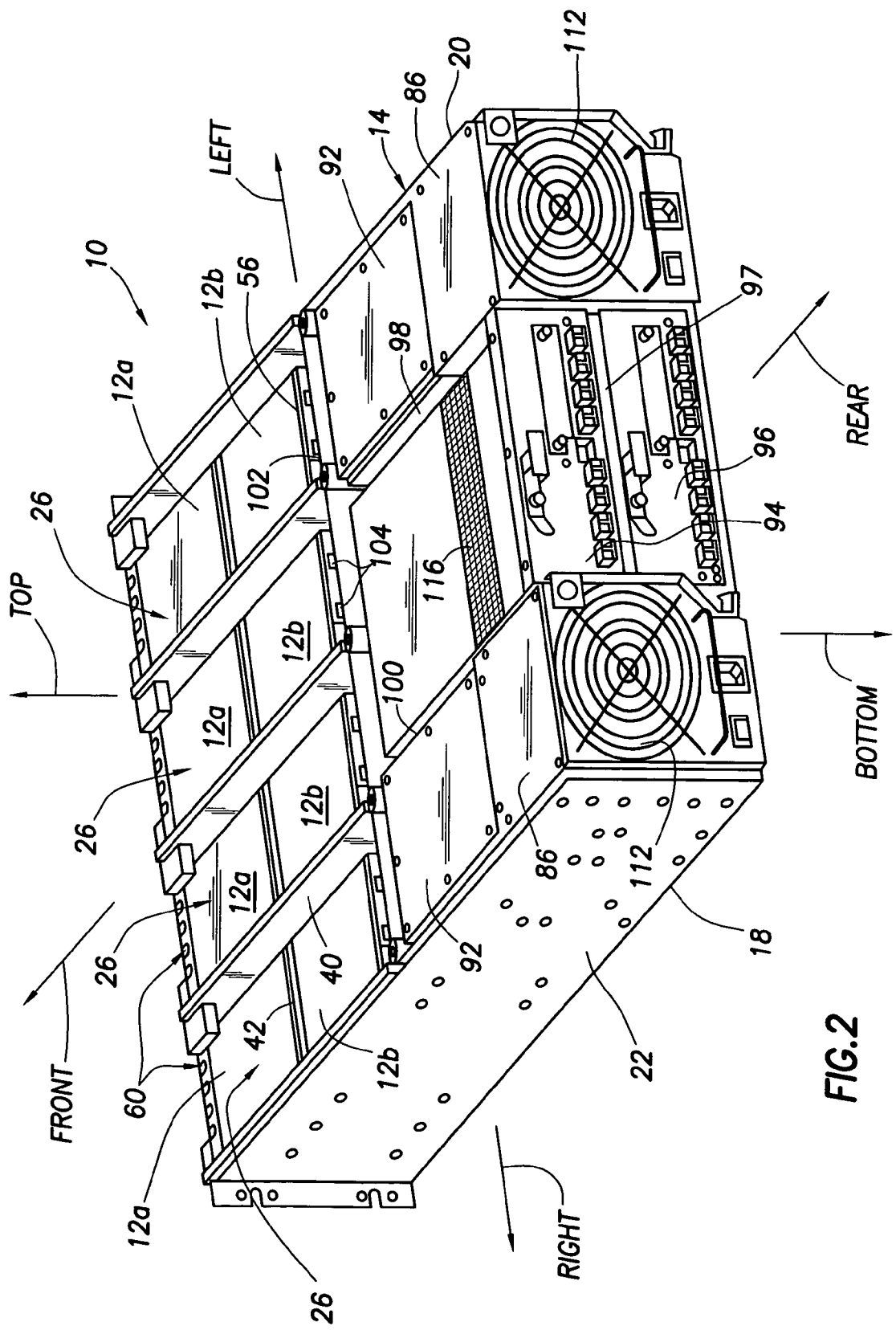
FIG. 2 is a rear perspective view of the support system.
Figure 3:
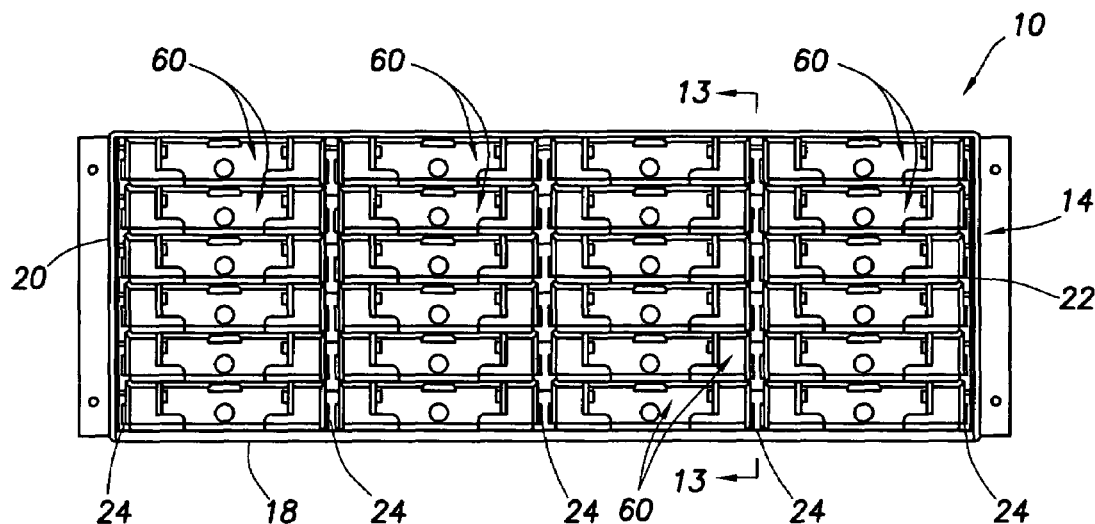
FIG. 3 is a front elevational view of the support system.

Sealed housing fan sections 86, each having a pair of series-connected axial cooling fans 88,90 therein, are positioned at the rear corners of the interior of the housing 14 directly to the rear of a pair of power modules 92, and on opposite sides of a vertically stacked pair of top and bottom electronics sections 94,96 having an air flow gap 97 therebetween (see FIG. 2). A pair of cooling plenums 98,100 are disposed horizontally between the stacked electronics sections 94,96 and the power modules 92 and communicate at their front ends with a cooling plenum 102 extending along the rear side of the midplane connector circuit board 56 which the rear disk drives 12b in the ganged disk drive pairs 12a,12b plug into. As illustrated in FIG. 2, the midplane circuit board 56 has tuned air transfer ports 104 extending therethrough and generally aligned with small vertical cooling air flow gaps 106 (see FIG. 16) between the vertical layers of supported drives 12a,12b.

The interior of the housing 14 to the rear of the compactly supported disk drive assemblies 26 is suitably partitioned in a manner such that operation of the fan sets 88,90 create the following representative flow of cooling air through the interior of the housing 14 and the electronic structures supported therein.

Referring now to FIGS. 4 and 9-12, during operation of the apparatus 10, the fan sets 88,90 create vacuums in the plenums 98,100,102 and draw ambient cooling air 108 (see FIG. 4) rearwardly through the vertical gaps 106 between the disk drive assemblies 26, across the top and bottom sides of the disk drives 12a and 12b, and then into the plenum 102 via the tuned ports 104 in the midplane circuit board 56. Air 108 entering the plenum 102 is drawn through the power modules 92 via front inlets 110 thereof (see FIGS. 9 and 10) and then discharged from the rear ends 112 of the fan sections 86 (see FIGS. 9 and 10).

At the same time, ambient cooling air 108 from the plenum 102 is drawn rearwardly through the interiors of the electronics sections 94,96 via open front ends 114 thereof, and then drawn outwardly from their interiors, via top and side openings 116 and 118 (see FIGS. 11 and 12), into the plenums 98,100. Air 108 entering the plenums 98,100 is drawn into the interiors of the power modules 92, via side openings 120 therein, and is then discharged from the open rear ends 112 of the fan housing sections 86 (see FIGS. 2, 4, 9 and 10).

This representatively illustrated use of the dual sets of serially connected cooling fans 88,90 and associated plenums behind the midplane circuit board 56 is at least generally known in the prior art and per se forms no part of the present invention other than being a preferred form of cooling the uniquely configured and supported disk drive assemblies 26 disposed forwardly of the midplane circuit board 56. As will readily be appreciated by those of skill in this particular art, other techniques of creating cooling air flows across the supported disk drive assemblies 26 could alternatively be employed if desired without departing from principles of the present invention.

Other modifications to the representatively illustrated disk support apparatus 10 could also be made, if desired, without departing from principles of the present invention. For example, while each electronic package assembly 26 has been representatively illustrated as including two ganged disk drives 12, a greater or lesser number of disk drives or other electronic packages could be operatively connected to a given pair of elongated support plate members 28. Further, instead of being horizontally mounted within the housing 14, the disk drive assemblies 26 could be vertically oriented such that the illustrated top and bottom side surfaces of the disk drives 12 face horizontally. Also, as previously mentioned, types of electronic packages other than disk drives could be operatively supported in the housing 14 using principles of the present invention.

As can be seen, with respect to the disk drives 12, the present invention provides a variety of advantages over conventional disk drive supporting methods and apparatus. For example, all of the disk drives are forwardly removable, thereby desirably eliminating the need for support trays which are forwardly movable out of the housing to then permit vertical removal from the tray of disk drives which they carry. Further, due to the combination of the support plates 28, the resilient bumpers 50 and the resilient latch structures 60, the supported disk drives 12 are desirably locked in all three axes against shock and vibration, and the latch handle portions 66 are restrained against vibration and rattling. Due to the unique use of the specially configured elongated support plate members 28, no supporting structure extends beneath any of the disk drives 12. The stacked disk drive assemblies 26 may thus be positioned vertically closer to one another while still providing cooling gaps therebetween. Moreover, in addition to the convective air cooling provided for the supported disk drives 12, the metal-to-metal contact between the elongated support plates 28 and their associated metal interior support walls 24 provides an efficient conductive heat removal path for the supported disk drives.

The foregoing detailed description is to be clearly understood as being given by way of illustration and example only, the spirit and scope of the present invention being limited solely by the appended claims.

What is claimed is:

1. Electronic apparatus comprising:
   a housing structure including a pair of spaced apart parallel walls having facing side surfaces with elongated grooves formed therein;
   projections disposed in said grooves;
   an electronic package having opposite side surfaces; and
   elongated parallel support members secured to said opposite side surfaces of said electronic package and slidingly received in said grooves, said support members having longitudinally sloped side edge portions wedgingly and resiliently engaged with said projections in said grooves,
   said grooves and said support members having, along substantially their entire lengths, non-uniform, complementarily configured widths that extend parallel to said side surfaces of said electronic package.

2. The electronic apparatus of claim 1 wherein:
   said projections are laterally extending projections extending transverse to said parallel walls.

3. The electronic apparatus of claim 1 wherein:
   said electronic package is a disk drive.

4. The electronic apparatus of claim 1 wherein:
   said support members are of a rigid material, and
   said projections are of a resilient material.

5. The electronic apparatus of claim 4 wherein:
   said elongated grooves have side surface holes formed therein, and
   said projections are snap-fitted into said holes.

6. The electronic apparatus of claim 1 wherein:
   said elongated grooves in said pair of spaced apart parallel walls horizontally oppose one another.

7. The electronic apparatus of claim 1 wherein:
   said electronic package is forwardly removable from said housing structure.

8. The electronic apparatus of claim 1 wherein:
   said parallel walls and said parallel support members slidingly received therein are of metal constructions and form conductive heat dissipation paths for said electronic package.

9. The electronic apparatus of claim 1 wherein:
   said spaced apart parallel walls are horizontally spaced apart, vertically extending walls.

10. Electronic apparatus comprising:
    a housing structure having an open front side and including a pair of spaced apart parallel walls having facing side surfaces with elongated grooves formed therein and longitudinally extending rearwardly from said open front side;

an electronic package with associated support portions on opposite sides thereof, said electronic package being in a rearwardly inserted orientation within said housing structure with said support portions being slidingly received in said grooves;

an elongated spring structure supported at opposite ends thereof on opposite sides of a front end portion of said electronic package; and a latch structure secured to a longitudinally central portion of said spring structure, said latch structure having a pivotal handle portion releasably locked to said housing structure, the releasably locked pivotal handle structure creating a deflection of said spring structure in a manner causing it to exert a rearwardly directed resilient force on said electronic package and a forwardly directed resilient force on said pivotal handle portion.

11. The electronic apparatus of claim 10 wherein:
said electronic package is a disk drive.

12. The electronic apparatus of claim 10 wherein:
said housing structure has a cam surface portion adjacent said front side thereof, and
said latch handle structure is rotatable relative to said rear end portion of said electronic package and has a cam portion slidingly engageable with said cam surface portion.

13. The electronic apparatus of claim 12 wherein:
said pair of parallel walls of said housing structure have front edge portions with recesses formed therein, said cam surface portion being defined by edge portions of said recesses, and
said cam portion is defined by opposite end pin portions of said latch handle structure which are insertable into said recesses and slidably engageable with said edge portions of said recesses as said latch handle structure is rotated relative to said front end portion of said electronic package.

14. The electronic apparatus of claim 10 wherein:
said latch structure further includes a rigid support structure secured to said longitudinally central portion of said spring structure, said handle portion being pivotally secured to and forcibly bearing against said rigid support structure in a manner causing it to rearwardly deflect said spring structure.

15. Electronic apparatus removably insertable into a support housing having wall structures defining an opposing pair of elongated parallel grooves, said electronic apparatus comprising:
an electronic package having front and rear ends, first and second opposite parallel sides extending between said front and rear ends, and third and fourth opposite parallel sides extending in a first direction between said first and second sides; and
elongated support plate members secured to and longitudinally extending along said third and fourth sides in front-to-rear directions and being longitudinally insertable rearwardly into said grooves, each support plate member having a side surface facing said electronic package, and a rigid side edge extending along substantially the entire length of the support plate member and having substantially planar longitudinal sections that are alternatingly parallel to said first electronic package side and sloped rearwardly and inwardly toward said second electronic package side, each elongated support plate member having a width extending in said first direction and decreasing in stages along substantially the entire length of the support plate member in a rearward direction.

16. The electronic apparatus of claim 15 wherein:
said electronic package is a disk drive.

17. The electronic apparatus of claim 15 wherein:
said elongated support plate members are each laterally positioned between said first and second sides of said electronic package.

18. The electronic apparatus of claim 15 wherein:
said electronic package is a first electronic package, and
said electronic apparatus further comprises a second electronic package disposed rearwardly of said first electronic package and having opposite sides to which rear end portions of said elongated support plate members are secured.

19. The electronic apparatus of claim 18 wherein:
each of said first and second electronic packages is a disk drive.

20. Electronic apparatus removably insertable into a support housing having wall structures defining an opposing pair of elongated parallel grooves, said electronic apparatus comprising:
an electronic package having front and rear ends, first and second opposite parallel sides extending between said front and rear ends, and third and fourth opposite parallel sides extending in a first direction between said first and second sides; and
elongated support plate members secured to and longitudinally extending alone said third and fourth sides in front-to-rear directions and being longitudinally insertable rearwardly into said grooves, each support plate member having a side surface facing said electronic package, and a side edge with longitudinal sections that are alternatingly parallel to said first electronic package side and sloped rearwardly and inwardly toward said second electronic package side, each elongated support plate member having a width extending in said first direction and decreasing in stages alone substantially the entire length of the support plate member in a rearward direction, said electronic package being a first electronic package, and said electronic apparatus further comprising a second electronic package disposed rearwardly of said first electronic package and having opposite sides to which rear end portions of said elongated support plate members are secured, said second electronic package having an external configuration substantially identical to that of said first electronic package, and said electronic apparatus further comprising connector circuit boards operatively coupled to the rear ends of said first and second electronic packages, and a bridging circuit board extending along said first sides of said first and second electronic packages and electrically coupling said connector circuit boards.

21. The electronic apparatus of claim 20 wherein:
said bridging circuit board is elongated in a front-to-rear direction and is configured to leave substantial portions of said first sides of said first and second electronic packages exposed to permit cooling air to be flowed in a front-to-rear direction across said substantial portions of said first sides of said first and second electronic packages without blocking the flow of the cooling air.

22. Electronic apparatus removably insertable into a support housing having wall structures defining an opposing pair of elongated parallel grooves, said electronic apparatus comprising:
- an electronic package having front and rear ends, first and second opposite parallel sides extending between said front and rear ends, and third and fourth opposite parallel sides extending in a first direction between said first and second sides; and
- elongated support plate members secured to and longitudinally extending alone said third and fourth sides in front-to-rear directions and being longitudinally insertable rearwardly into said grooves, each support plate member having a side surface facing said electronic package, and a side edge with longitudinal sections that are alternatingly parallel to said first electronic package side and slope rearwardly and inwardly toward said second electronic package side, each elongated support plate member having a width extending in said first direction and decreasing in stages alone substantially the entire length of the support plate member in a rearward direction; and
- a latch handle structure movably supported forwardly adjacent said front end of said electronic package and being operative to cooperatively engage a portion of the support housing and releasably lock said electronic package within the support housing.

23. The electronic apparatus of claim 22 wherein:
said latch handle structure is pivotable relative to said electronic package about an axis parallel to said first and second sides of said electronic package and transverse to the lengths of said elongated support plate members.

24. The electronic apparatus of claim 23 wherein:
said latch handle structure has opposite end pins formed thereon and operative to cammingly engage surface portions of the wall portions of the support housing.

25. The electronic apparatus of claim 22 wherein:
said electronic apparatus further comprises an elongated spring structure having opposite ends secured to front end portions of said elongated support plate members, and
said latch handle structure is movable to a locking orientation in which it causes a rearward resilient deflection of said spring structure.

26. Electronic apparatus comprising:
a housing structure including a pair of horizontally spaced apart parallel vertical walls having facing side surfaces with elongated grooves formed therein and longitudinally extending horizontally in front-to-rear directions;
laterally extending resilient projections disposed in said grooves; and
first and second forwardly removable disk drive packages rearwardly inserted between said pair of vertical walls, each of said disk drive packages including:
front and rear disk drives having opposite left and right side edges along which a pair of elongated support plate members are secured and longitudinally extend in front-to-rear directions, said support plate members being slidingly received in a horizontally facing pair of said grooves and each having a longitudinally spaced plurality of longitudinally sloped, generally vertically facing rigid, substantially planar side edge portions wedgingly and resiliently engaged with corresponding ones of said projections.

27. The electronic apparatus of claim 26 wherein:
said first and second disk drive packages have a vertical gap therebetween, and
said electronic apparatus further comprises a cooling system operative to flow cooling air rearwardly through said gap.

28. The electronic apparatus of claim 27 wherein:
said electronic apparatus further comprises additional non-drive electronic components disposed within said housing structure and which said cooling system is operative to flow cooling air over.

29. The electronic apparatus of claim 26 wherein:
said sloped side edge portions of said elongated support plate members are generally upwardly facing surfaces.

30. The electronic apparatus of claim 26 further comprising:
additional ones of said vertical walls and additional, similarly supported disk drive packages within said housing structure, the disk drives supported in said housing structure being in a 4U48 form factor.

31. Electronic apparatus comprising:
a housing structure including a pair of horizontally spaced apart parallel vertical walls having facing side surfaces with elongated grooves formed therein and longitudinally extending horizontally in front-to-rear directions;
laterally extending resilient projections disposed in said grooves; and
first and second forwardly removable disk drive packages rearwardly inserted between said pair of vertical walls, each of said disk drive packages including:
front and rear disk drives having opposite left and right side edges along which a pair of elongated support plate members are secured and longitudinally extend in front-to-rear directions, said support plate members being slidingly received in a horizontally facing pair of said grooves and each having a longitudinally spaced plurality of longitudinally slope, generally vertically facing side edge portions wedgingly and resiliently engaged with corresponding ones of said projections,
said pair of vertical walls each having a front edge with a cam slot formed therein, and
each of said first and second disk drive packages further including a latch structure having:
an elongated spring structure secured at opposite ends thereof to front end portions of said elongated support plate members,
a rigid support structure secured to a longitudinally central portion of said spring structure; and
a pivotal handle structure having opposite ends with cam members disposed thereon and being slidingly received in a pair of said cam slots, said handle structure being removably secured to said rigid support structure and forcibly engaging it in a manner such that said spring structure is rearwardly deflected to maintain a resilient, rearwardly directed force on said elongated support plate members, and a resilient, forwardly directed force on said pivotal handle structure.

* * * * *